Sept. 18, 1962 J. E. R. HARRISON 3,054,969

CRYSTAL FILTERS FOR MULTIFREQUENCY SOURCE

Filed July 13, 1960

INVENTOR.
JOHN E. R. HARRISON
BY
T. L. Styner
ATTORNEY 3,054,969
Patented Sept. 18, 1962

3,054,969

CRYSTAL FILTERS FOR MULTIFREQUENCY SOURCE

John E. R. Harrison, Rochester, N.Y., assignor to General Dynamics Corporation, Rochester, N.Y., a corporation of Delaware Filed July 13, 1960, Ser. No. 42,534
5 Claims. (Cl. 331—76)

This invention relates to frequency synthesizers comprising a reference frequency generator and filter circuits from which may be derived and selected any one of a plurality of frequencies.

In the superheterodyne type radio-transmitter or receiver, the carrier wave with its signals must be changed in frequency in two or more steps with two or more mixer stages. Desirably, the injection frequency or local oscillator source for each mixer stage is precisely related. In the copending application Serial No. 42,698, filed July 13, 1960, entitled "Digitally Tuned Transmitter-Receiver" and assigned to the assignee of this application, there is disclosed such a superheterodyne transmitter-receiver. In that receiver, particularly, it is necessary to inject into each of the mixers any one of a series of digitally, preferably decimally, related frequencies. It is costly and otherwise impractical to employ precisely ground crystals for each of the injection frequencies.

The principal object of this invention, accordingly, is to design an improved multifrequency source employing a single high precision reference source, the accuracy of which may be reflected in a large number of related output frequencies.

A more specific object of this invention is to provide an improved frequency source from which may be obtained a large number of precisely accurate frequencies by simple switching operations.

A still more specific object of this invention is to provide an improved frequency source from which may be obtained a large number of precisely decimally-related frequencies.

The objects of this invention are attained by generating a spectrum of frequencies in a harmonic generator, such as an overdriven amplifier, which is excited by a single reference source of high precision. A series of low-cost crystals are then selectively connected in circuit, one-by-one, by switch mechanisms. The switch mechanism is so constructed and arranged as to shunt to ground the undesired frequencies through the unused crystals, resonant tank circuits being employed in connection with the crystal circuits to effectively suppress all frequencies from the spectrum generator except the one selected frequency. The frequency synthesizer of this invention has extremely high selectivity and is capable of sharply distinguishing between signals separated in one kilocycle steps in the range of several magacycles.

Other objects and features of this invention will become obvious to those skilled in the art by referring to the specific embodiment described in the following specification and shown in the accompanying drawing, in which.

Figure 1:
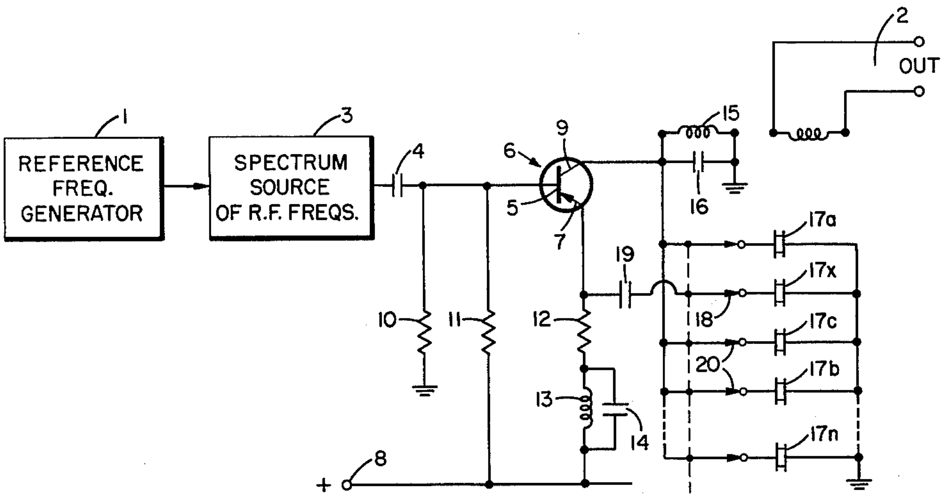
FIG. 1 is a schematic wiring diagram of one embodiment of this invention.

From the reference frequency generator 1, in FIG. 1, is to be derived a series of frequencies in output circuit 2 which are integrally related to the reference frequency. Where the output frequencies are in the megacycle range and are to differ in increments of 1 kc. or 10 kc., for example, it is preferred that the reference frequency generator be fixed at 1 kc. The spectrum generator 3 is excited by the reference frequency generator and may comprise any well-known circuit for generating a wave rich in harmonics. An overdriven transistor amplifier, for example, will generate such a wave with emphasis in the spectrum of those frequencies which are integrally related with the reference driving frequency. If the reference driving frequency is 1 kc., the output of the spectrum source, when viewed on a panoramic receiver, would resemble a comb with frequency peaks 1 kc. apart.

The entire output of the spectrum source is applied through coupling condenser 4 to the base 5 of transistor 6. The particular transistor shown is of the P-N-P type with the emitter 7 connected to the positive voltage terminal 8 and with the collector 9 connected to reference ground. The input biasing resistor 10 and the biasing resistor 11 are of such values as to maintain the transistor in normally conducting condition. In the particular transistor amplifier shown, the emitter 7 is common to both the input and output circuits of the transistor, and the emitter biasing resistor 12, connected between the emitter and source 8, is of such a value as to provide complete degenerative feedback. In series with the biasing resistor 12 is connected the inductance 13 and parallel condenser 14, constituting a parallel resonant tank circuit. The tank circuit is tuned to the center frequency of the band of frequencies to be passed by the amplifier.

The output of the transistor including the collector in the illustrated example includes the inductance 15 tuned by condenser 16 and likewise tuned to the center frequency of the band frequencies to be passed by the amplifier. One end of the tank circuit is grounded as shown, while the other end is connected through crystals **17*a*–17*n* to ground. All of the crystals, except one, 17*x*, are connected in parallel between tank circuit 15 and ground. Crystal 17*x* is connected through contact 18 of a switch structure and through blocking condenser 19 to the common or emitter electrode 7 of the transistor. The remaining contacts, 20, of the switch structure are interlocked with contact 18 so that the emitter 7 may be selectively coupled to ground through any one of the several crystals 17*a*–17*n*, while the same time switching the remaining crystals into the ground circuit between the output tank circuit 15** and ground. A wafer-type switch mechanism of the type shown in applicant's copending application, Serial No. 42,533, filed July 13, 1960, entitled the same as and assigned to the assignee of this application, may be employed.

Figure 2:
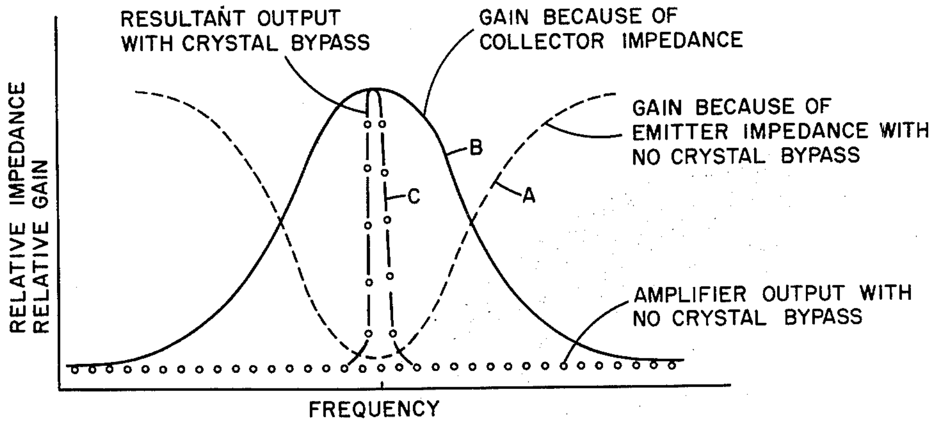
FIG. 2 shows the frequency versus relative gain of important parts of the circuit of FIG. 1.

Both tank circuits 13—14 and 15—16 are parallel resonant circuits tuned to the center frequency of the desired band. Now, if there were no crystals connected in the emitter of the transistor, there would be no by-pass around tank circuit 13—14. It is evident, then, that the parallel resonant circuit 13—14 would not permit current to flow at its resonant frequency and thus no transistor action would take place. On the other hand, at frequencies removed from resonance, tank circuit 15—16 presents a low impedance load in the output or collector electrode of the amplifier and thus no amplification nor output to output circuit 2 can take place. That is, referring to FIG. 2, the gain of the amplifier because of the high emitter impedance, with no crystal by-pass, is substantially zero, as shown by curve A. The collector impedance is high and output occurs only at the resonant frequencies, as shown by curve B. Now, when the crystals **17*x* is connected to by-pass the tank circuit 13—14 in the emitter circuit, the emitter circuit has a very low impedance at the resonant frequency of the crystal and a very high impedance at frequencies removed from the crystal resonance. Unwanted frequencies, accordingly, are degeneratively fed back. The resultant output then reflects the gain of the transistor at the resonant frequency of the emitter by-pass crystal and the effect of negative feedback at all frequencies removed from resonance. The resultant output is sharp as indicated by curve C, FIG. 2. The circuit is inherently stable and provides selectivity far above that of a simple crystal filter. Any leakage of undesired frequencies from the spectrum source through the transistor is shunted to ground by the remaining crystals 17***a*–17*n* in the output of the filter.

By the circuits of this invention, any one of a large number of frequencies can be digitally selected and all unwanted frequencies effectively suppressed with but one reference frequency generator. Low-cost crystals may be used in the filter.

What is claimed is:

1. In combination, a spectrum generator, an amplifier coupled to said generator, said amplifier comprising an input electrode, an output electrode and a common electrode, a load impedance in circuit with said output electrode, said load impedance comprising a first resonant circuit which presents relatively high impedance to said amplifier over a predetermined band of frequencies and having low impedance to frequencies out of said band, a biasing resistor in circuit with said common electrode for degeneratively biasing said amplifier, a second resonant circuit in series with said resistance, said second resonant circuit being resonant to frequencies throughout said predetermined band for providing relatively high degenerative feedback in said amplifier of all frequencies in said band, a band-pass filter, said band-pass filter having a passband which is narrow compared to said predetermined band and being connected in shunt to said second resonant circuit for providing low degenerative voltages to said amplifier for frequencies only within the passband to said filter.

2. In combination, a spectrum generator, an amplifier coupled to said generator, said amplifier comprising an input electrode, an output electrode and a common electrode, a load impedance in circuit with said output electrode, said load impedance comprising a first resonant circuit which presents relatively high impedance to said amplifier over a predetermined band of frequencies and having low impedance to frequencies out of said band, a biasing resistor in circuit with said common electrode for degeneratively biasing said amplifier, a second resonant circuit in series with said resistance, said second resonant circuit being resonant to frequencies throughout said predetermined band for providing relatively high degenerative feedback in said amplifier of all frequencies in said band, a plurality of crystal-like filters, said filters being series resonant, respectively, to numerically-related frequencies in said band, and switch means for selectively connecting each one of said filters in shunt across said second resonant circuit.

3. In combination, a spectrum generator, an amplifier coupled to said generator, said amplifier comprising an input electrode, an output electrode and a common electrode, a load impedance in circuit with said output electrode, said load impedance comprising a first resonant circuit which presents relatively high impedance to said amplifier over a predetermined band of frequencies and having low impedance to frequencies out of said band, a second resonant circuit in series with said common electrode, said second resonant circuit being resonant to frequencies throughout said band for providing relatively high degenerative feedback in said amplifier of all frequencies in said band, a plurality of series resonant crystal filters, and switch means for selectively connecting any one of said crystals in shunt across said second resonant circuit and for connecting the remaining crystals in shunt across said first resonant circuit.

4. In combination in a frequency synthesizer, a generator for generating a wide-band spectrum of frequencies, an amplifier, said amplifier having a control electrode, an output electrode and a common electrode, said generator being coupled to said control electrode, a resonant tank circuit connected in circuit with said common electrode so that voltages developed across the impedance of said tank circuit is added degeneratively in said amplifier to the signal applied to said control electrode, a plurality of band-pass filters of relatively narrow passband, the center frequencies of said passbands of said filters, respectively, being uniformly spaced, and switch means for selectively connecting any one of said filters across said resonant tank circuit and for connecting the remaining filters in shunt across the output circuit of said amplifier.

5. In combination in a frequency synthesizer, a spectrum generator for generating a wide-band spectrum of frequencies, an amplifier coupled to said generator, said amplifier having a control electrode, an output electrode and a common electrode, a first resonant tank circuit connected in circuit with said common electrode so that voltages developed across the impedance of said tank circuit is added in said amplifier out of phase with the signal applied to said control electrode, a second resonant tank circuit connected in circuit with said output electrode, a plurality of crystals of different resonant frequencies, and switch means for selectively connecting any one of said crystals across said first resonant tank circuit and for connecting the remaining crystals across said second tank circuit.

References Cited in the file of this patent

UNITED STATES PATENTS

| | | |
|---|---|---|
| 2,280,605 | Roberts | Apr. 21, 1942 |
| 2,352,455 | Summerhayes | June 27, 1944 |

FOREIGN PATENTS

| | | |
|---|---|---|
| 527,902 | Great Britain | Oct. 18, 1940 |